United States Patent [19]
Tarantola et al.

[11] Patent Number: 6,060,948
[45] Date of Patent: May 9, 2000

[54] PROTECTION CIRCUIT FOR CONTROLLING THE GATE VOLTAGE OF A HV LDMOS TRANSISTOR

[75] Inventors: Mario Tarantola, Bareggio; Giuseppe Cantone, Syracuse; Angelo Genova, Delia; Roberto Gariboldi, Lacchiarella, all of Italy

[73] Assignee: STMicroelectronics S.r.l., Agrate Brianza, Italy

[21] Appl. No.: 09/096,272

[22] Filed: Jun. 11, 1998

[30] Foreign Application Priority Data

Jun. 24, 1997 [EP] European Pat. Off. .............. 97830296

[51] Int. Cl.⁷ ..................................................... H03K 7/162
[52] U.S. Cl. ........................... 327/589; 327/588; 327/390; 327/391
[58] Field of Search ..................... 327/586, 587, 327/589, 588, 390, 391, 392

[56] References Cited

U.S. PATENT DOCUMENTS

| | | | |
|---|---|---|---|
| 5,138,200 | 8/1992 | Barsanti et al. | 327/541 |
| 5,212,415 | 5/1993 | Murakami et al. | 327/390 |
| 5,365,118 | 11/1994 | Wilcox | 327/109 |
| 5,572,156 | 11/1996 | Diazzi et al. | 327/217 |
| 5,742,196 | 4/1998 | Fronen et al. | 327/382 |
| 5,883,547 | 3/1999 | Diazzi et al. | 327/589 |

FOREIGN PATENT DOCUMENTS

| | | |
|---|---|---|
| 0 589 123 A1 | 9/1992 | European Pat. Off. . |
| 0 545 059 A1 | 10/1992 | European Pat. Off. . |
| 0 743 752 A1 | 5/1995 | European Pat. Off. . |

*Primary Examiner*—Timothy P. Callahan
*Assistant Examiner*—An T. Luu
*Attorney, Agent, or Firm*—Theodore E. Galanthay; Allen, Dyer, Doppelt, Milbrath & Gilchrist, P.A.

[57] ABSTRACT

A circuit for charging a capacitance using an LDMOS integrated transistor functioning as a source follower stage and controlled, in a manner to emulate a high voltage charging diode of the capacitance via a bootstrap capacitor charged by a diode connected to the supply node of the circuit, and by an inverter driven by a logic control circuit as a function of a first Low Gate Drive Signal and of a second logic signal. The second logic signal is active during a phase where the supply voltage is lower than the minimum switch-on voltage of the integrated circuit. The circuit further includes a second inverter functionally referred to the charging node of the bootstrap capacitor and to the voltage of the output node of the inverter. The second inverter has an input coupled to the second logic signal and an output coupled to the gate node of the LDMOS transistor for preventing accidental undue switch-on of the LDMOS transistor.

15 Claims, 2 Drawing Sheets

PROTECTION CIRCUIT FOR CONTROLLING THE GATE VOLTAGE OF A HV LDMOS TRANSISTOR

FIELD OF THE INVENTION

The present invention relates to integrated circuits and, in particular, to driving circuits for power stages. Particularly, the invention relates to a bootstrap system, or the like, wherein a capacitor is charged by means of an LDMOS integrated transistor emulating a high voltage diode.

BACKGROUND OF THE INVENTION

In integrated circuits that comprise output stages for driving discrete power devices or themselves integrated on the same chip containing the control circuitry, it is common to use a bootstrap capacitor to ensure a correct powering of the driving stage. In these systems, it is essential that the bootstrap capacitor is charged in very short periods of time. This is usually attained through a diode emulator LDMOS transistor used to rapidly charge the bootstrap capacitor.

In the case of a driving circuit for a so-called High Side Driver (HSD) of a half-bridge output stage, the LDMOS transistor should be capable of charging the bootstrap capacitor when the HSD is referred to low voltage, that is, when its output is low. The LDMOS transistor should emulate a high impedance when the HSD is referred to high voltage, that is, when its output is high. These functioning conditions must also be ensured during the HSD switching phase from high to low voltage or vice versa. These conditions must also be ensured despite possible current injections caused by charging and discharging of the capacitances associated with the LDMOS integrated structure that must sustain the high voltage supply of the power device.

The publication WO 94/27370 discloses a half-bridge circuit comprising a driving module for the lower device and a driving floating module for the higher power device. The driving module for the higher transistor is realized in an isolated well region and a properly controlled LDMOS transistor emulates a high voltage charging diode of a bootstrap capacitor. In these cases it is necessary to control the effects of the parasite bipolar junction transistors associated with the LDMOS integrated structure.

The document EP-A-0743752, points out and describes certain conditions that originate problems tied to the switch-on of the parasitic transistors of the LDMOS integrated structure. The reference also describes different circuit layouts capable of averting current consumption caused by the switch-on of parasitic transistors of the LDMOS integrated structure, and to avoid the occurrence of conditions that may cause the destruction of the integrated device itself.

The above cited European patent application EP-A-0743752, is herein incorporated by way of direct reference. FIG. 1 highlights the protecting circuit described in the European patent application. According to the approach described in the European patent application, there exists a functioning phase of the integrated circuit, referred to as UVLO, when the voltage supply Vs is less than the minimum switch-on voltage of the entire integrated device including also the LDMOS transistor. During this time, with switches SW1 and SW2 both open, the potential of the body node VB of the LDMOS structure is kept at the circuit ground potential.

FIG. 1 shows that the LDMOS transistor is controlled through a bootstrap capacitor Cp charged by a diode D1 connected to the circuit supply node Vs, by an inverter IO1 driven by a Logic Control circuit as a function of a Low Gate Drive Signal and a second logic drive signal (UVLOb). This second logic drive signal is active during a phase wherein the supply voltage Vs is lower than the minimum switch-on voltage of the integrated device.

The protecting circuit as described in the European patent application herein reproduced in FIG. 1, while usually effective to prevent spurious switch-on, has a disadvantage of requiring to carry out such a function, that the current be such that the voltage drop on the R resistance is sufficient to switch-on the transistor Q1. This condition may not occur in some cases, for example, in quasi-static conditions or in the presence of leakage currents.

In fact, when the LDMOS transistor (LD) is OFF (node A linked to ground potential via the inverter IO1), its gate (G) represents a high impedance node.

This defines a particularly critical condition from the point of view of leakage currents entering the node G, or of possible charge injections on the same node G through the capacitive coupling between the gate-drain capacitance of the LDMOS transistor and the bootstrap capacitor Cp, as caused by steep fronts during high voltage switching. These charges that may be accidentally injected on the node G tend to increase the potential which, not being limited, could theoretically reach a voltage equal to Vs+Vz, where Vz is the breakdown voltage of the diode D1 that charges the bootstrap capacitor Cp.

In any case, it is sufficient that the voltage Vgs reaches a level of a few Volts to cause an undesired switch-on of the LDMOS transistor (LD), despite the existence of a switch-off logic signal on the output node A of the control inverter IO1. A similarly undue switch-on of the LDMOS transistor may take place in the switch-off phase, if the voltage Vs is taken to ground in a time span that would not allow the gate potential of the LDMOS transistor to follow the source voltage. The effect of an anomalous switch-on is a reverse current that may damage the integrated LDMOS transistor or, in any case, discharge the capacitance C charged by it.

SUMMARY OF THE INVENTION

In view of the foregoing background, it is therefore an object of the invention to implement a secure control of the gate voltage of the LDMOS transistor to avert occurrences of undesired switch-on.

The present invention provides an effective approach by using a clamp circuit of the LDMOS gate node potential, conditioned by an active logic signal during a phase in which the supply voltage is lower than the switch-on voltage of the integrated device comprising the LDMOS transistor that emulates a high voltage diode for charging a capacitor.

While a normal active clamp placed between the gate node of the integrated transistor and ground should be capable of bearing a voltage twice the supply voltage less Vbe, the conditioned clamp circuit of the invention may be realized with integrated components which are required to bear a voltage limited to a level similar to that of the supply voltage. The protecting circuit layout of the invention includes an inverter, substantially referred to the charging node of the bootstrap capacitor control circuit of the LDMOS integrated transistor and to the output node of the controlling inverter, and driven by the logic signal UVLOb which through the output, drives the LDMOS gate node.

BRIEF DESCRIPTION OF THE DRAWINGS

The different aspects and advantages of the invention will be even more evident through the following description of a preferred embodiment and by referring to the attached figures, wherein.

DETAILED DESCRIPTION OF THE PREFERRED EMBODIMENTS

Figure 2:
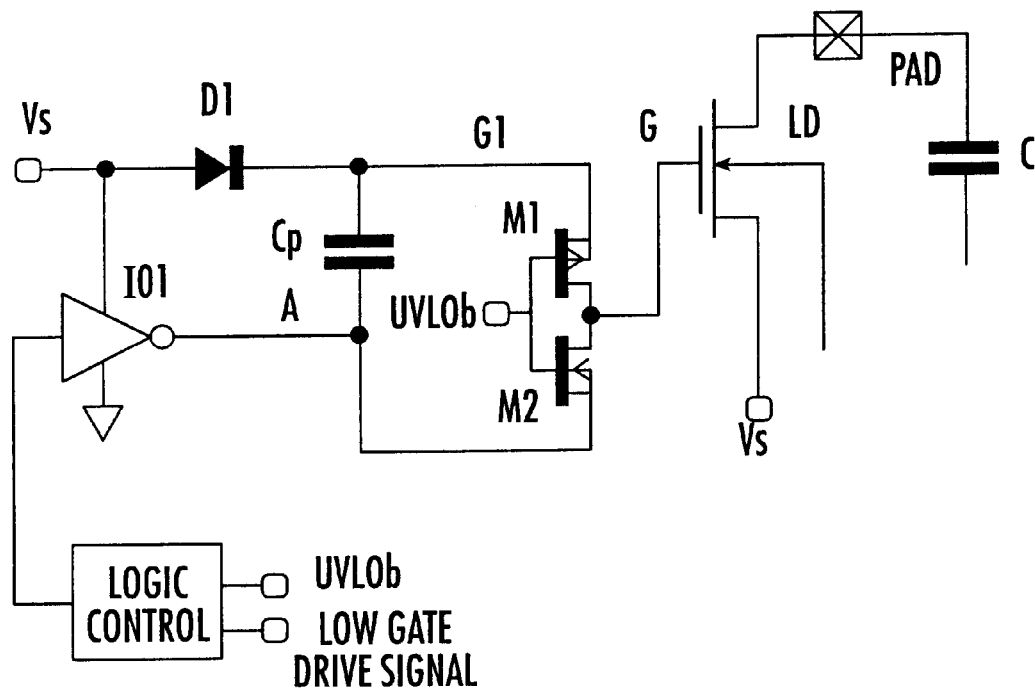
FIG. 2 shows the modified protecting a control circuit for the LDMOS gate according to the present invention.

Referring to FIG. 2, the PMOS transistor M1 illustratively has its source connected to the cathode of the diode D1 and to the charging terminal of the bootstrap capacitor Cp. The drain is connected to the drain of the NMOS transistor M2 and to the gate of the LDMOS (LD) integrated transistor. The source of the transistor M2 is connected to the output node A of the control inverter IO1 and to the other terminal of the bootstrap capacitor Cp.

The gates of transistors M1 and M2 are controlled by the logic signal UVLOb, which is 0 when the supply voltage Vs of the device is lower than the minimum switch-on voltage of the integrated device (a condition referred to as "under voltage lock-out") and takes the value of the supply voltage Vs once this threshold is surpassed. Thus, under normal operating conditions (UVLOb=Vs), the low gate drive signal, which in the case of driving a half-bridge circuit may reproduce the driving signal of the lower power device, makes the voltage oscillate on the output node A of the inverter IO1 between the ground potential (LDMOS OFF) and the supply potential Vs (LDMOS ON.)

During the phase in which the node A is referred to ground, the capacitor Cp is charged to a voltage equal to Vs less a Vbe (where Vbe is the direct voltage of the D1 diode.) In this condition the transistor M1 has a positive voltage Vgs (=Vbe) and therefore is OFF, while the transistor M2 has a Vgs=Vs and is consequently ON, forcing the voltage of the gate node G to the value of the node A, that is, to ground. Then, in this phase, the gate of the LDMOS transistor (LD) is forced to ground thereby ensuring a switch-off condition of the transistor.

In the subsequent functioning phase, the logic command on the inverter IO1 goes low and the voltage on the output node A of the inverter reaches the value of the supply voltage Vs. The node G1 reaches a voltage value equal to that of the node A, plus the contribution of the capacitor Cp, in other words equal to 2Vs−Vbe.

Under these conditions, the transistor M1 is ON having a Vgs=−Vs+Vbe, and so the voltage on the gate node G, identical to the voltage on the node G1, is given by 2Vs−Vbe, a value that can assure the switch-on of the LDMOS transistor (LD). In this phase, the transistor M2 is OFF because Vgs=0.

If a so-called "Under Voltage" condition occurs, that is, when the logic signal UVLOb=0, given that the gate of the transistors M1 and M2 and the output node A are at zero, M1 is ON (Vgs=−Vs+Vbe) while M2 is OFF (Vgs=0.). Even in this case, the voltage on the gate node G of the LDMOS transistor is equal to the voltage existing on the node G1 and the LDMOS transistor is ON, and, therefore, the capacitance C may be charged (as it occurs in the known circuit of FIG. 1.)

Figure 1:
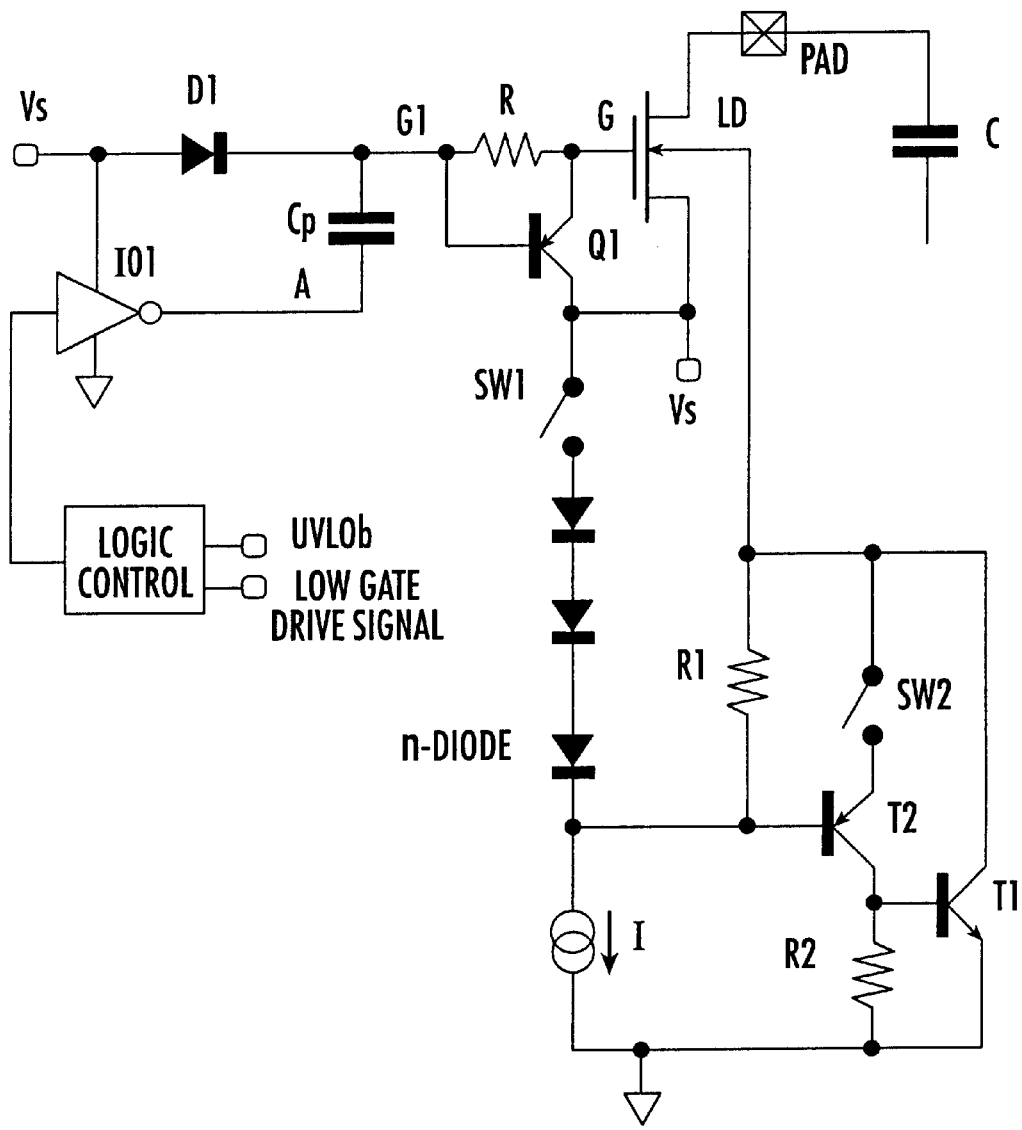
FIG. 1 shows, as already cited, a driving and control scheme of an LDMOS integrated structure, according to the prior art.

Hence, the circuit of the invention in operation forces to zero the voltage on the gate node of the transistor LD when it is in a condition of interdiction (while in the known circuit of FIG. 1 it remained to an uncontrolled value greater or equal to Vs−Vbe). During a UVLO phase, the circuit preserves a behavior similar to that of the known circuit of FIG. 1.

That which is claimed is:

1. A circuit for charging a capacitance comprising:
    an LDMOS integrated transistor functioning as a source follower stage and controlled to emulate a high voltage charging diode of the capacitance;
    a first inverter;
    a diode;
    a bootstrap capacitor charged by the diode at a supply voltage by the first inverter;
    a logic control circuit for driving the first inverter responsive to a low gate drive signal and a first logic signal which is active during a phase wherein the supply voltage is lower than a minimum switch-on voltage of the circuit; and
    a second inverter functionally referred to a charging node of said bootstrap capacitor and to a voltage of an output of said first inverter, said second inverter having an input coupled to the first logic signal and an output coupled to a gate of said LDMOS integrated transistor for preventing an undesired switch-on of the LDMOS integrated transistor.

2. A circuit according to claim 1, wherein said second inverter comprises a PMOS transistor having a source connected to the charging node of said diode.

3. A circuit according to claim 2, wherein said second inverter further comprises an NMOS transistor having a source connected to the output of said first inverter.

4. A circuit according to claim 3, wherein drains of said PMOS and NMOS transistors are connected together and to the gate of said LDMOS transistor.

5. A circuit according to claim 4, wherein gates of said PMOS and NMOS transistors are connected together and to the second logic signal.

6. A half-bridge driver circuit comprising:
    upper and lower power transistors and respective upper and lower drive modules therefore;
    a first bootstrap capacitor for the upper drive module;
    an LDMOS integrated transistor functioning as a source follower stage and controlled to emulate a high voltage charging diode of said first bootstrap capacitor;
    a first inverter;
    a diode;
    a second bootstrap capacitor charged by the diode at a supply voltage by the first inverter;
    a logic control circuit for driving the first inverter responsive to a low gate drive signal and a first logic signal which is active during a phase wherein the supply voltage is lower than a minimum switch-on voltage of the circuit; and
    a second inverter functionally referred to a charging node of said bootstrap capacitor and to a voltage of an output of said first inverter, said second inverter having an input coupled to the second logic signal and an output coupled to a gate of said LDMOS integrated transistor for preventing an undesired switch-on of the LDMOS integrated transistor.

7. A half-bridge driver circuit according to claim 6, wherein said second inverter comprises a PMOS transistor having a source connected to the charging node of said diode.

8. A half-bridge driver circuit according to claim 7, wherein said second inverter further comprises an NMOS transistor having a source connected to the output of said first inverter.

9. A half-bridge driver circuit according to claim 8, wherein drains of said PMOS and NMOS transistors are connected together and to the gate of said LDMOS transistor.

10. A half-bridge driver circuit according to claim 9, wherein gates of said PMOS and NMOS transistors are connected together and to the second logic signal.

11. A method for charging a capacitance in a circuit comprising the steps of:
  controlling an LDMOS integrated transistor functioning as a source follower stage to emulate a high voltage charging diode of the capacitance;
  charging a bootstrap capacitor by a diode at a supply voltage by a first inverter;
  driving the first inverter responsive to a low gate drive signal and a first logic signal which is active during a phase wherein the supply voltage is lower than a minimum switch-on voltage of the circuit; and
  driving a second inverter functionally referred to a charging node of the bootstrap capacitor and to a voltage of an output of the first inverter, the second inverter having an input coupled to the first logic signal and an output coupled to a gate of the LDMOS integrated transistor for preventing an undesired switch-on of the LDMOS integrated transistor.

12. A method according to claim 11, wherein the second inverter comprises a PMOS transistor having a source connected to the charging node of the diode.

13. A method according to claim 12, wherein the second inverter further comprises an NMOS transistor having a source connected to the output of the first inverter.

14. A method according to claim 13, wherein drains of the PMOS and NMOS transistors are connected together and to the gate of the LDMOS transistor.

15. A method according to claim 14, wherein gates of the PMOS and NMOS transistors are connected together and to the second logic signal.

* * * * *